United States Patent [19]
Allen et al.

[11] Patent Number: 5,962,184
[45] Date of Patent: Oct. 5, 1999

[54] PHOTORESIST COMPOSITION COMPRISING A COPOLYMER OF A HYDROXYSTYRENE AND A (METH) ACRYLATE SUBSTITUTED WITH AN ALICYCLIC ESTER SUBSTITUENT

[75] Inventors: Robert David Allen; Ratnam Sooriyakumaran, both of San Jose, Calif.

[73] Assignee: International Business Machines Corporation, Armonk, N.Y.

[21] Appl. No.: 08/766,259

[22] Filed: Dec. 13, 1996

[51] Int. Cl.$^6$ ..................................................... G03F 7/004
[52] U.S. Cl. ........................ 430/270.1; 430/326; 430/330; 430/910; 522/31
[58] Field of Search ................................ 430/270.1, 910, 430/326, 330; 522/31

[56] References Cited

U.S. PATENT DOCUMENTS

| | | | |
|---|---|---|---|
| 5,045,431 | 9/1991 | Allen et al. | 430/270 |
| 5,212,043 | 5/1993 | Yamamoto et al. | 430/910 |
| 5,225,316 | 7/1993 | Vogel et al. | 430/270 |
| 5,262,281 | 11/1993 | Bauer et al. | 430/323 |
| 5,275,908 | 1/1994 | Elsaesser et al. | 430/165 |
| 5,324,804 | 6/1994 | Steinmann | 526/271 |
| 5,399,647 | 3/1995 | Nozaki | 430/270.1 |
| 5,419,998 | 5/1995 | Mayes et al. | 430/905 |
| 5,443,690 | 8/1995 | Takechi et al. | 430/910 |
| 5,492,793 | 2/1996 | Breyta et al. | 430/270.14 |
| 5,496,678 | 3/1996 | Imai et al. | 430/176 |
| 5,506,088 | 4/1996 | Nozaki et al. | 430/270.1 |
| 5,547,812 | 8/1996 | Collins et al. | 430/270.1 |
| 5,635,332 | 6/1997 | Nakano et al. | 430/270.1 |
| 5,660,969 | 8/1997 | Kaimoto | 430/270.1 |

OTHER PUBLICATIONS

C. Mertesdorf et al., "Structure/Property Relationship of Acetal and Ketal Blocked Polyvinyl Phenols as Polymeric Binder in 2–Component Positive Deep–UV Photoresist", M. Althuis (Ed), Polymers for Microelectronics ACS Anaheim Meeting 95.

E. Reichmanis et al., "Chemical Amplication Mechanisms for Microlithography", Chem. Mater. 1991, 3, 394–407.

H. Kikuchi et al., "Positive Chemical Amplication Resist for Deep UV Lithography", Journal of Photopolymer Science and Technology, Vol. 4, No. 3 (1991), 357–360.

K. Nozaki et al., A Novel Polymer for a 193–nm Resist, Journal of Photopolymer Science and Technology, vol. 9, No. 3 (1996) 509–522.

R. D. Allen et al., "Progress in 193 nm Positive Resists", Journal of Photopolymer Science and Technology, vol. 9, No. 3 (1996) 465–474.

K. Nakano et al., "Positive Chemically Amplified Resist for ArF Excimer Laser Lithography Composed of a Novel Transparent Photoacid Generator and an Alicyclic Terpolymer", SPIE vol. 2438, (1995), pp. 433–443.

M. Takahashi et al., "Evaluation of Chemically Amplified Resist Based on Adamantyl Methacrylate for 193 nm Lithography", SPIE vol. 2438, (1995) pp. 422–432.

*Primary Examiner*—John S. Chu
*Attorney, Agent, or Firm*—Robert B. Martin; Dianne E. Reed

[57] ABSTRACT

The present invention relates to an improved chemically amplified photoresist composition comprising (i) a photosensitive acid generator and (ii) a polymer comprising the reaction product of hydroxystyrene with a monomer selected from acrylate or methacrylate having an alicyclic ester substituent.

12 Claims, No Drawings

PHOTORESIST COMPOSITION COMPRISING A COPOLYMER OF A HYDROXYSTYRENE AND A (METH) ACRYLATE SUBSTITUTED WITH AN ALICYCLIC ESTER SUBSTITUENT

FEILD OF THE INVENTION

The present invention relates to an improved lithographic photoresist composition and process for its use in the manufacture of integrated circuits.

BACKGROUND OF THE INVENTION

There is a desire in the industry for higher circuit density in microelectronic devices which are made using lithographic techniques. One method of increasing the number of components per chip is to decrease the minimum feature size on the chip, which requires higher lithographic resolution. The use of shorter wavelength radiation (e.g., deep UV e.g., 190 to 315 nm) than the currently employed mid-UV spectral range (e.g., 350 nm to 450 nm) offers the potential for higher resolution. However, with deep UV radiation, fewer photons are transferred for the same energy dose and higher exposure doses are required to achieve the same desired photochemical response. Further, current lithographic tools have greatly attenuated output in the deep UV spectral region.

In order to improve sensitivity, several acid catalyzed chemically amplified resist compositions have been developed such as those disclosed in U.S. Pat. No. 4,491,628 (Jan. 1, 1985) and Nalamasu et al., "An Overview of Resist Processing for Deep-UV Lithography", J. Photopolym. Sci. Technol. 4, 299 (1991). The resist compositions generally comprise a photosensitive acid generator and an acid sensitive polymer. The polymer has acid sensitive side chain (pendant) groups which are bonded to the polymer backbone and are reactive towards a proton. Upon imagewise exposure to radiation, the photoacid generator produces a proton. The resist film is heated and, the proton causes catalytic cleavage of the pendant group from the polymer backbone. The proton is not consumed in the cleavage reaction and catalyzes additional cleavage reactions thereby chemically amplifying the photochemical response of the resist. The cleaved polymer is soluble in polar developers such as alcohol and aqueous base while the unexposed polymer is soluble in nonpolar organic solvents such as anisole. Thus the resist can produce positive or negative images of the mask depending of the selection of the developer solvent.

Although chemically amplified resist compositions generally have suitable lithographic sensitivity, in certain applications, their performance can be improved by (i) increasing their thermal stability in terms of thermal decomposition and plastic flow and (ii) increasing their stability in the presence of airborne chemical contaminants. For example, in some semiconductor manufacturing processes, post image development temperatures (e.g., etching, implantation etc.) can reach 200° C. Brunsvold et al., U.S. Pat. No. 4,939,070 (issued Jul. 3, 1990) and U.S. Pat. No. 4,931,379 (issued Jun. 5, 1990) disclose chemically amplified, acid sensitive resist compositions having increased thermal stability in the post-image development stage. Brunsvold's resist compositions form a hydrogen bonding network after cleavage of the acid sensitive side chain group to increase the thermal stability of the polymer. Brunsvold avoids hydrogen bonding moieties prior to the cleavage reaction because such hydrogen bonding is known to unacceptably thermally destabilize the acid sensitive side chain. Although Brunsvold resists have suitable thermal stability, they also have lower sensitivity and therefore are unsuitable in certain applications.

With respect to chemical contamination, MacDonald et al., SPIE 1466 2, (1991) reported that due to the catalytic nature of the imaging mechanisms, chemically amplified resist systems are sensitive toward minute amounts of airborne chemical contaminants such as basic organic substances. These substances degrade the resulting developed image in the film and cause a loss of the line width control of the developed image. This problem is exaggerated in a manufacturing process where there is an extended and variable period of time between applying the film to the substrate and development of the image. In order to protect the resist from such airborne contaminants, the air surrounding the coated film is carefully filtered to remove such substances. Alternatively, the resist film is overcoated with a protective polymer layer. However, these are cumbersome processes. U.S. Pat. No. 5,492,793 disclose a photosensitive resist composition comprising (i) a photosensitive acid generator and (ii) a polymer comprising hydroxstyrene and acrylate, methacrylate or a mixture of acrylate and methacrylate. The resist has high lithographic sensitivity and also exhibits surprising stability in the presence of airborne chemical contaminants. This photoresist is commercially available and widely used in the industry. However, in some applications, there is a desire in the industry for a resist which exhibits improved thermal and imaging properties and an increased plasma etch resistance.

Therefore, there still is a need in the art for an acid sensitive, chemically amplified photoresist composition having stability in the presence of airborne chemical contaminants with improved thermal and imaging properties for use in semiconductor manufacturing.

It is therefore an object of the present invention to provide an improved acid sensitive, chemically amplified photoresist composition.

Other objects and advantages will become apparent from the following disclosure.

SUMMARY OF THE INVENTION

The present invention relates to a photosensitive resist composition comprising (i) a photosensitive acid generator and (ii) a polymer comprising hydroxystyrene and acrylate, methacrylate or a mixture of acrylate and methacrylate. The ester substituent of the acrylate or methacrylate is an alicyclic substituent, preferably isobornyl. The resist has high lithographic sensitivity and high thermal stability with minimal shrinkage after exposure with thermal cycling. The resist also exhibits surprising stability in the presence of airborne chemical contaminants. The present invention also relates to the process for using the photoresist composition of the present invention in semiconductor manufacturing to make integrated circuit chips.

A more thorough disclosure of the present invention is presented in the detailed description which follows.

DETAILED DESCRIPTION OF THE INVENTION

The present invention relates to a chemically amplified, photosensitive resist composition comprising (i) a radiation-sensitive acid generator and (ii) a polymer comprising hydroxystyrene and a monomer selected from acrylate or methacrylate where the ester substituent is an acid labile (acid cleavable), alicyclic group.

The hydroxystyrene monomer or oligomer component of the polymer provides base solubility to the polymer in the resist composition. The hydroxystyrene is suitably the para or meta isomer (preferably para) and optionally can be substituted with various substitutents which do not interfere with the lithographic utility of the polymer such as halogens, $C_{1-5}$ alkoxy (e.g., methoxy), or lower $C_{1-5}$ alkyl such as methyl or ethyl (e.g., α-methyl hydroxystyrene and ortho methylhydroxystyrene) and ortho and polymers comprising such monomers should be considered equivalent to those claimed herein.

The acrylate or methacrylate monomer or oligomer component of the polymer provides acid sensitivity to the polymer. Suitable alicyclic ester substitutents (e.g., $C_7$–$C_{12}$ preferably $C_{10}$–$C_{11}$) are acid cleavable with secondary or tertiary attachment points such as adamantyl or isobornyl e.g., 2-methyl-2-adamantyl and 2-isobornyl. Other suitable acid cleavable, alicyclic ester substitutents will be known to those skilled in the art.

The alicyclic ester group of the acrylate or the methacrylate is an acid labile group which surprisingly provides enhanced dissolution inhibition of the polymer in alkaline developer. Upon imagewise exposure to radiation, the photogenerated acid cleaves the alicyclic ester group to convert it from dissolution inhibiting ester to a base soluble organic acid thereby enabling image development of the composition.

Optionally, the polymer may also comprise a third monomer such as an acrylate or methacrylate monomer having another type of acid labile, ester substitutents such as alkyl e.g., t-butyl, aryl (e.g., methylbenzyl) and preferably heterocyclic ester substituent such as tetrahydropyranyl or tetrahydrofuranyl which can provide enhanced sensitivity and/or dissolution contrast.

The copolymer used in the process of the present invention can be prepared by standard radical copolymerization to yield random copolymers. For example, alicyclic methacrylate can be copolymerized with (i) p-tert-butoxycarbonyloxystyrene (a hydroxystyrene precursor monomer) with subsequent thermal cleavage or mild acidolysis of the t-butoxycarbonyl group to form p-hydroxystyrene/methacrylate copolymer. Alternatively and preferably, acetoxystyrene is copolymerized with alicyclic acrylate or methacrylate. Generally, acetoxystyrene is mixed under nitrogen at an elevated temperature of about 50 to 100° C. with the ester monomer in a suitable solvent such as toluene or THF, along with a small amount of a free radical catalyst such as benzoyl peroxide. The product polymer poly(acetoxystyrene-co-acrylate) is then deacylated with mild base (e.g., dimethylaminopyridine, ammonium hydroxide, carbonate or bicarbonate) in a nonaqueous solvent such as an alcohol solvent (methanol or propanol) to form the hydroxystyrene/acrylate copolymer. Alternatively, the hydroxystyrene/acrylate or methacrylate copolymer can be a block copolymer. Alternatively, the copolymer can be prepared directly from hydroxystyrene monomer and the acrylic monomer.

Because of the unexpectedly high dissolution inhibition of the alicyclic ester substituent, the copolymer suitably contains only minor amounts of the acid labile alicyclic methacrylate/acrylate monomer unit in the range of about 5 to 20 mole %. This enables the copolymer to contain high amounts of the hydroxystyrene monomer (80 to 95%) which improves the performance of resist. The low amount of alicyclic monomer unit results in reducing post-exposure shrinkage of the developed resist with thermal cycling to less than 5% preferably less than 4% and more preferably less than 3%. The copolymer suitably has a number-average molecular weight (relative to polystyrene standard) ranging from 5,000 to 15,000. The copolymer has a high glass transition temperature of e.g., greater than about 150° C. The copolymer also has a high acid sensitivity. The acid labile, alicyclic ester groups of the copolymer are surprisingly thermally stable in the presence of the phenolic hydroxy groups up to a temperature of about 250° C. This enables a high pre-exposure heating of a film of the composition which results in substantially improved lithographic performance. This also enables high temperature processing in the preparation of the polymer.

A variety of photosensitive acid generators can be used in the composition of the present invention. Generally, suitable generators will have a high thermal stability (e.g., to temperature >160°) so they are not degraded during the pre-exposure processing. Suitable photosensitive acid generators for use in the present invention include ionic iodonium sulfonate, triaryl sulfonium hexafluoroantimonate, diaryliodonium metal halides, and certain non-ionic acid generators such as tris(sulfonate) or pyrogallol, and N-sulfonyloxynaphthalimides.

Preferred are diaryl iodonium (alkyl or aryl) sulfonate, triphenylsulfonium triflate and N-sulfonyloxynaphthalimide generators such as N-camphorsulfonyloxynapthalimide, N-pentafluorobenzenesulfonyloxnaphthalimide and iodonium sulfonates where the iodonium cations are bis(p-t-butylphenyl) iodonium, bis(p-tolyl) iodonium and bis (phenyl) iodonium and sulfonate anions are camphorsulfonate, p-methylbenzene sulfonate (tosyl anion) and trifluoromethane sulfonate.

The composition of the present invention is readily used in standard lithographic imaging processes. Generally, the first step of such process involves coating the substrate with a film comprising the polymer and a photosensitive acid generator both dissolved in a suitable solvent. Suitable substrates are comprised of silicon, ceramics, polymer or the like. Suitable organic casting solvents include ethyl cellosolve acetate, cyclohexanone, propylene glycol monomethyl ether acetate, and the like. The film will generally comprise about 80 to about 99.5 weight % of the polymer and about 0.5 to about 20 weight % of the photoacid generator both dissolved in the organic solvent. Optionally, the film can contain additives such as polymers and small molecules to adjust the films dissolution rate (e.g., polyhydroxystyrene), etch resistance, optical density, radiation sensitivity, adhesion and the like. The film can be coated on the substrate using art known techniques such as spin or spray coating, doctor blading or electrodeposition.

Generally, prior to exposure of the film, the film is heated to a low temperature to remove solvent. However, due to the unique thermal stability of polymer, including the thermal stability of the acid labile ester groups, the film of the present invention can be heated to a higher temperature in the pre-exposure heating step. Preferably, the film is heated to a temperature which is high enough to be at least about 20 centigrade degrees below the glass transition temperature of the film, more preferably to a temperature which is at or above the glass transition temperature (Tg) of the film and below the acid labile ester thermal cleavage temperature for a short time of at least about 10 to 15 seconds (preferably a minimum of about 30 seconds) to about 15 minutes. This high temperature pre-exposure heating step surprisingly functions to protect the film and the undeveloped image formed in the film from degradation due to airborne chemical contaminants during the extended and variable pre- and post-exposure period prior to the development of the image in the film.

The glass transition temperature (Tg) of the film can be readily determined by art known procedures such as a differential scanning calorimetry or dynamic mechanical analysis. The thermal cleavage temperature of the acid-labile group of the polymer can be determined by thermogravimetric analysis involves heating the material at a constant rate and recording weight loss. IR spectroscopy involves heating several samples and then analyzing the IR spectra of the samples to determine the extent of thermal cleavage of the acid labile group. Dissolution analysis involves heating several films at various temperatures and then determining reduction in film thickness after development.

Generally, after pre-exposure baking, the film is imagewise exposed to radiation suitably electron beam or electromagnetic, preferably electromagnetic radiation such as ultraviolet or x-ray preferably deep ultraviolet radiation, preferably at a wavelength of about 190 to 315 nm, most preferably at 248 nm. Suitable radiation sources include mercury, mercury/xenon, eximer laser, xenon lamps, electron beam or x-ray. Generally, the exposure dose is less than 100 millijoule/cm$^2$, preferably less than 50 millijoule/cm$^2$. Generally, the exposure of the film is at ambient temperature. In the exposed areas of the film, photosensitive acid generator produces free acid. Because the radiation dose is so low, there is essentially negligible radiation induced cleavage of the ester groups and negligible radiation induced main chain scission decomposition of the polymer. The free acid causes acid catalyzed cleavage of the alicyclic, acid labile, ester groups of the polymer in the exposed area typically during the post-exposure baking step. The cleavage of the alicyclic ester groups substantially alters the dissolution rate of the polymer and the differential solubility between the exposed and unexposed areas of the film enables aqueous base development of the image in the film.

After the film has been exposed to radiation, it is heated again to an elevated temperature preferably above about 70° to about 160° C. and more preferably about 120° to about 140° C. for a short period of time of about 30 to 300 seconds. The elevated temperature functions in part to enhance the acid catalyzed cleavage of the ester pendant groups. However, this high temperature post exposure baking also surprisingly substantially improves the contrast and resolution of the developed images in the photoresist composition of the present invention.

The last step of the process of the present invention involves development of the image in the film. Suitable development techniques are known to those skilled in the art. Preferably, the image is solvent developed preferably in an aqueous base solvent for environmental improvement, preferably an industry standard solvent without metal ions such as tetraalkyl ammonium hydroxide preferably at a concentration of 0.26 normal. The image in the film has high resolution and straight side walls without defects caused by airborne chemical contaminants. Further, the film has a high Tg for thermal stability in subsequent processing and also exhibits minimal shrinkage during thermal processing and negligible cracking. Also the film has high plasma etch resistance for subsequent device fabrication.

The following examples are detailed descriptions of methods of preparation and use of the process of the present invention. The detailed preparations fall within the scope of, and serve to exemplify, the more generally described methods set forth above. the examples are presented for illustrative purposes only, and are not intended as a restriction on the scope of the invention.

EXAMPLE 1

Synthesis of(4-Hydroxystyrene Monomer)

4-Acetoxystyrene (105 grams, 0.65 mole) in tetrahydrofuran (THF) (400 ml) was stirred at room temperature with 14.8 Molar ammonium hydroxide (52 ml, 0.77 mole) for 18 hours. Afterwards, the solution was washed three times with brine (250 ml) and dried over anhydrous Magnesium sulfate. Solvent was removed in a rotary evaporator and the viscous liquid was dried under high vacuum for 24 hours to give a waxy solid. Typically, this waxy solid is around 95% pure (by NMR), remainder being THF.

EXAMPLE 2

Synthesis of Poly(4-hydroxystyrene-co-Isobornyl Methacrylate)

4-Hydroxystyrene (10.2 grams, 0.085 mole) and isobornylmethacrylate (3.33 grams, 0.015 mole) were placed with isopropyl alcohol (50 grams) in a round bottom flask equipped with a condenser and a nitrogen inlet. Azoisobutyronitrile (AIBN) (0.55 grams) was added to this solution and stirred until completely dissolved. Then, the solution was evacuated with the aid of a Firestone valve and purged with nitrogen. The contents were then heated to reflux for 18 hours. Afterwards, the solution was diluted with isopropyl alcohol (IPA) (100 ml) and added dropwise into deionized water (1.5 liter) to affect precipitation. The precipitated polymer was filtered (frit), washed twice with deionized water (100 ml) and dried under vacuum at 50 degree C. Yield: 10 grams.

EXAMPLE 3

Lithographic Performance

A Hydroxystyrene-Isobornyl methacrylate (HS-IBM) copolymer (85%/15% molar composition) was formulated as a high performance DUV resist by mixing with a casting solvent and photoacid generator (PAG). Propylene glycol methyl ether acetate (PGMEA) was commonly used as the solvent, while a number of PAGS listed above were used, most often the onium salt type. A typical formulation of solvent, polymer and PAG was 80–85% solvent, 15–20% HS-IBM Polymer, and about 1% or less PAG. The formulation was spin-coated on clean silicon wafers, post-apply baked at a temperature of about 140/150° C. for 1 minute, exposed with 248 nm light with an appropriate dose and post-expose baked at about 140° C. Then, the exposed film was developed using a standard developer (e.g., 0.26 N tetramethyl ammonium hydroxide in water), for 60 seconds, followed by a pure water rinse. The HS-IBM resist formulation processed this way has an $E_o$ (dose to clear) of about 15 mJ/cm$^2$; contrast (gamma) of 8; unexposed dissolution rate approaching zero, exposed dissolution rate (at 30 mJ/cm$^2$) of 2–2.5 $\mu$m/min., and an imaging dose of about 25 mJ/cm$^2$. Using this photoresist, high quality 0.22 $\mu$m images were produced in a resist film having a thickness of 0.6–0.70 $\mu$m. The exposed film shows approximately 1–2% shrinkage after post exposure bake and before development.

EXAMPLE 4

Lithographic Performance

A photoresist composition was prepared according to Example 3 using a terpolymer containing 80% HS, 10% IBM and 10% t-butylmethacrylate tBM. The addition of the small amount of tBM enhances the exposed dissolution rate substantially. The exposed dissolution rate at 30 mJ/cm$^2$ was about 10–15 $\mu$m/min. Contrast (gamma) was 10. The resist provided high quality 0.25 $\mu$m images at a dose of about 20 mJ/cm$^2$ when exposed through a DUV stepper. The increased resist response using this terpolymer allows for lower process temperatures to be used (120–140° C.), which is an advantage in some semiconductor manufacturing process lines.

EXAMPLE 5

The resist formulation of Examples 3 was modified by using a terpolymer structure (80/10/10) HS/IBM and cyclic, tetrahydrofuranyl methacrylate (THF). The high reactivity of THF to acid-catalyzed deprotection allowed for a further reduction of the process temperatures to 80–120° C. A resist formulated from this terpolymer gave a sensitivity of 5–6 mJ/cm$^2$ when processed at temperatures at or below 100° C. High quality imaging resulted from this resist.

Although this invention has been described with respect to specific embodiments, the details thereof are not to be constructed as limitations for it will be apparent that various embodiments, changes, and modifications may be resorted to without departing from the spirit and scope thereof, and it is understood that such equivalent embodiments are intended to be included within the scope of this invention.

What is claimed is:

1. A photosensitive resist composition comprising (i) a radiation-sensitive acid generator and (ii) a polymer comprising hydroxystyrene and a monomer selected from acrylate or methacrylate having an alicyclic ester substituent, wherein the hydroxystyrene monomer comprises about 80–95% of the polymer.

2. The composition of claim 1 wherein the polymer is poly(hydroxystyrene-co-isobornyl methacrylate).

3. The composition of claim 1 wherein the polymer is poly(hydroxystyrene-co-isobornyl acrylate).

4. The composition of claims 1 wherein the acid generator is iodonium sulfonate.

5. A photosensitive resist composition comprising (i) iodonium sulfonate and (ii) poly(hydroxystyrene-co-isobornyl acrylate), wherein the hydroxystyrene monomer comprises about 80–95% of the polymer.

6. A photosensitive resist composition comprising (i) iodonium sulfonate and (ii) poly(hydroxystyrene-co-isobornyl methacrylate), wherein the hydroxystyrene monomer comprises about 80–95% of the polymer.

7. The composition of claim 1 wherein the polymer further comprises a monomer selected from acrylate or methacrylate having a t-butyl, tetrahydropyranyl, or tetrahydrofuranyl ester substituent.

8. A process for generating a resist image on a substrate comprising the steps of:

(a) coating a substrate with a film comprising (i) a radiation-sensitive acid generator and (ii) a polymer comprising hydroxystyrene and monomer selected from acrylate or methacrylate having an alicyclic ester substituent; wherein the hydroxystyrene monomer comprises about 80–95% of the polymer;

(b) heating the film to a temperature above 20 degrees centigrade below the glass transition temperature of the film;

(c) imagewise exposing the film to radiation; and (d) developing the image to expose the substrate.

9. The process of claim 8 wherein the polymer is poly(hydroxystyrene-co-isobornyl methacrylate).

10. The process of claim 8 wherein the polymer is poly(hydroxystyrene-co-isobornyl acrylate).

11. The process of claims 8 wherein the acid generator is iodonium sulfonate.

12. The process of claim 8 wherein the polymer further comprises a monomer selected from acrylate or methacrylate having a t-butyl, tetrahydropyranyl, or tetrahydrofuranyl ester substituent.

* * * * *